MICROPOWER COMPLEMENTARY MONOSTABLE MULTIVIBRATOR

Filed Oct. 27, 1967

INVENTOR.
Alan G. Thiele

BY Mueller, Aichele & Rauner

ATTYS.

United States Patent Office 3,544,817
Patented Dec. 1, 1970

3,544,817

MICROPOWER COMPLEMENTARY MONOSTABLE MULTIVIBRATOR

Alan G. Thiele, Phoenix, Ariz., assignor to Motorola, Inc., Franklin Park, Ill., a corporation of Illinois Filed Oct. 27, 1967, Ser. No. 678,554
Int. Cl. H03k 3/26
U.S. Cl. 307—273 9 Claims

ABSTRACT OF THE DISCLOSURE

Disclosed is a low power monostable multivibrator employing complementary bipolar transistors and is characterized by a fast output pulse rise time, a fast output pulse fall time, a high duty cycle capability, a high trigger sensitivty, and high output pulse width stability. One pair of complementary transistors in the multivibrator rapidly responds to an input trigger pulse to switch the multivibrator from one to another of its two conductive states, and another complementary transistor pair responds to a timing signal a predetermined time after the multivibrator has changed states to return the multivibrator to its standby state.

BACKGROUND OF THE INVENTION

This invention relates generally to a monostable multivibrator and more particularly to a low power monostable multivibrator using complementary transistors.

Conventionally, monostable multivibrators in the prior art were constructed using noncomplementary bipolar transistors. A disadvantage of the noncomplementary transistorized prior art monostable multivibrator circuit is that the circuit's output pulse rise and fall times at a low power consumption are relatively slow. In these prior art circuits, the high impedance levels dictated by the micropower requirements combine with the finite active device and stray capacities to produce circuit time constants which exceed the desired pulse transition times. For some prior art circuits, the output pulse rise time can be made adequately fast since it is determined mainly by device turn on time, but the associated output pulse fall time is still limited by the above circuit time constants.

A second limitation of conventional noncomplementary monostable multivibrator circuits is their inability to operate at a high duty cycle. Since both timing and recovery currents are supplied by resistive sources, recovery time is invariably an appreciable fraction of the monostable period. Thus an increased duty cycle capability requires a reduction in the resistance of the recovery path of the timing element, and such reduction results in an undesirable increase in circuit power consumption.

Still another disadvantage of the micropower noncomplementary monostable multivibrator circuits is that these circuits are not amenable to simultaneous output pulse width stabilization against the expected temperature and supply voltage variations. In particular, at low supply voltage levels, the mitter-base junction voltages of the active devices within the multivibrator circuit become an appreciable fraction of the supply voltage. The nonlinearity and temperature dependence of the PN junction current-voltage characteristics result in high sensitivty of the monostable period to variations in supply voltage and temperature. Using silicon devices in conventional prior art monostable multivibrator circuits at supply voltage levels below a few volts, this pulse width sensitivity becomes intolerable in most applications where laboratory conditions cannot be maintained.

In addition to the conventional noncomplementary multivibrators described above, some multivibrators have been designed using complementary transistors. However, none of these complementary designs presently known include the regenerative transistor circuitry of the present invention.

SUMMARY OF THE INVENTION

The micropower monostable multivibrator to be described employs complementary bipolar active devices to circumvent the above disadvantages of the prior art monostable multivibrator circuits. The monostable circuit according to this invention has been developed for flexibility in micropower applications wherein fast transistion times, high duty cycle capability, and pulse width stability are required.

An object of this invention is to provide a new and improved monostable multivibrator operable to produce pulses having fast rise and fall time at a very low power drain.

Another object of this invention is to provide a monostable mutlivibrator having a high duty cycle capability.

Another object of this invention is to provide a monostable multivibrator operable to produce output pulses whose width remains substantially constant over a wide range of ambient temperature and supply voltage.

A further object of this invention is to provide a monostable multivibrator circuit which exhibits a high trigger sensitivity.

The present invention features a complementary monostable multivibrator having one complementary regenreative transistor pair which rapidly responds to an input trigger pulse to switch the multivibrator from a standby conductive state to a triggered conductive state. The multivibrator further includes another complementary regenerative transistor pair which rapidly responds to a timing signal to return the multivibrator to its standby conductive state a predetermined time after the multivibrator has been in its triggered state.

These and other objects and features will be more fully apparent from the following description of the accompanying drawings wherein:

IN THE DRAWINGS

Briefly described, this invention includes a first regenerative transistor pair which operates on a trigger pulse to rapidly switch the multivibrator from its standby state to its triggered state. A second regenerative transistor pair is connected to the first regenerative transistor pair and responds to a timing signal to return the multivibrator to its standby state a predetermined time after it has been in its triggered state. The first and second transistor pairs are connected to a common output terminal and to a timing circuit which produces the timing signal that is applied to the second transistor pair.

DESCRIPTION OF THE INVENTION

Identification of circuit components

Figure 1:
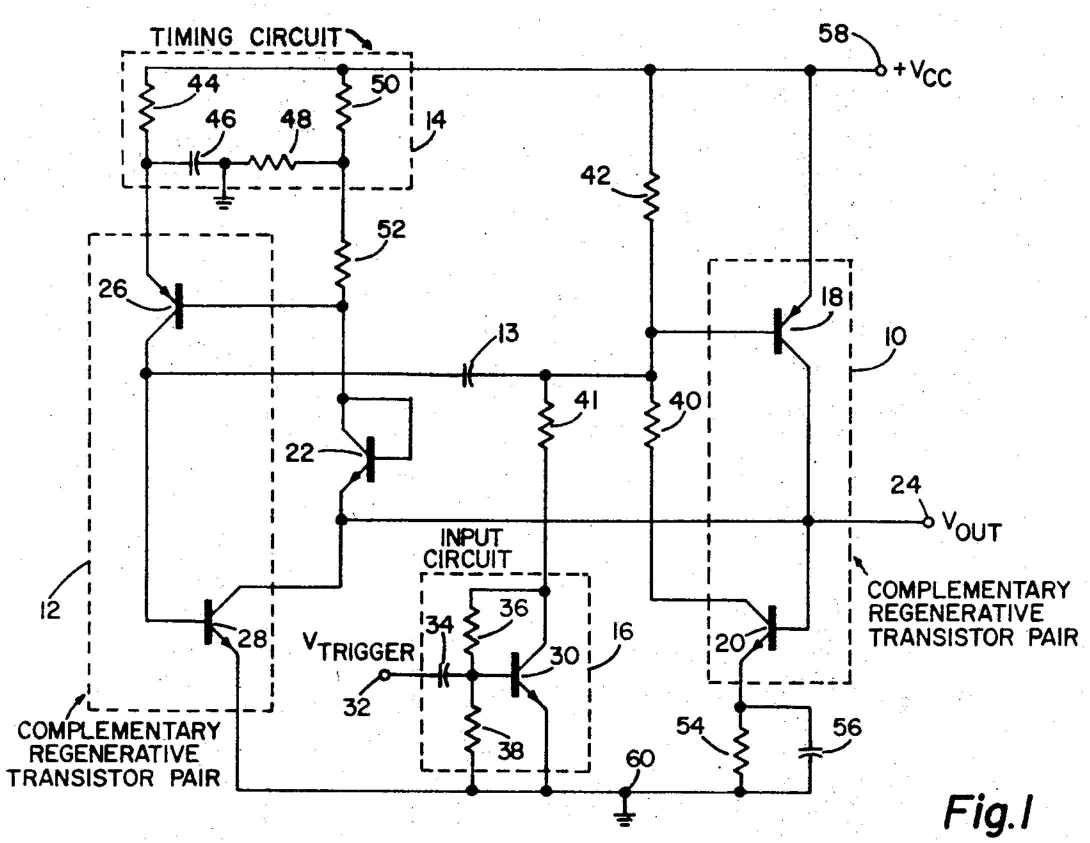
FIG. 1 is a schematic diagram of a preferred embodiment of this invention.

The monostable multivibrator circuit according to this invention which is illustrated in schematic in FIG. 1 of the drawing includes a first regenerative transistor pair 10 having first and second complementary transistors 18 and 20 connected with their collector-base paths in a regenerative loop. A second regenerative transistor pair 12 includes third and fourth complementary transistors 28 and 26 which also have their collector-base paths connected in a regenerative loop. A circuit output terminal 24 is connected to both of the regenerative pairs 10 and 12. A timing circuit 14 is connected between a voltage supply terminal 58 and the second regenerative pair 12, and an input circuit 16 is connected between the first transistor pair 10 and an input terminal 32 to which input trigger pulses are applied. The remaining circuit components will be identified below in the description of circuit operation.

Description of circuit operation

Assume that the circuit in FIG. 1 is in its "standby" state with no trigger pulse applied to the input terminal 32. In the standby state the voltage at the ouput terminal 24 is equal to the saturation voltage $V_{CE}$(SAT) of transistor 28, so that, using positive logic, the standby state will be referred to hereinafter as the binary "zero" state of the multivibrator. When the circuit is triggered and the output terminal 24 rises to several tenths of a volt below $V_{CC}$ the circuit is in its "triggered" or binary "one" state. For the zero state of the multivibrator, transistor 26 is "on" but not saturated. Transistor 28 is in saturation, clamping the voltage at the output terminal $V_{OUT}$ to the $V_{CE}$(SAT) of transistor 28, and diode 22 is conducting current through resistor 52 into the collector of transistor 28. The first and second transistors 18 and 20 in the first regenerative pair 10 are both turned off, with the base voltage of each held below the transistor turn on level by the voltage divider resistors 36, 38, 41 and 42. With transistors 26 and 28 conducting the timing capacitor 46 is charged to the emitter voltage of transistor 26 which is two emitter-base-junction voltage ($2V_{BE}$) above $V_{OUT}$.

If a positive going trigger pulse (see FIG. 2A) is now applied to the input terminal 32 and coupled through capacitor 34 to the base of the input transistor 30 to turn the latter on, current will flow through resistor 42 and resistor 41 to produce a negative going pulse at the base of transistor 18. This pulse tends to turn on transistor 18. The negative going pulse is also coupled through capacitor 13 to the base of transistor 28, turning the latter transistor off and producing regenerative turn-off action in transistor pair 12. A positive going transition at the base of transistor 26 tends to turn the latter transistor off in the transistor pair 12. Such regenerative action rapidly turns off transistors 28 and 26. As transistor 28 turns off, transistor 18 turns on and the voltage at the output terminal 24 rises sharply towards the supply voltage $V_{CC}$, turning on transistor 20 by regenerative action. Thus, the first and second transistors 18 and 20 in the first regenerative pair 10 are rapidly turned on by the same voltage transition which is coupled through capacitor 13 to rapidly turn off the third and fourth transistors 26 and 28 in the second regenerative transistor pair 12.

When the output terminal 24 swings to a high voltage level which is several tenths of a volt below $V_{CC}$, diode 22 becomes reverse biased and disconnects the voltage divider 48, 50 from the output line. Immediately after the transition to the quasistable one state, the base of the third transistor 26 is at the open circuit voltage of the voltage divider 48, 50 and the timing capacitor 46 in the timing circuit 14 begins to change toward the supply voltage $V_{CC}$. Since transistor 26 is turned off during the quasistable one state, the monostable period is determined by the time constant of resistor 44 and capacitor 46.

The monostable multivibrator remains in the one state until the timing capacitor 46 charges to a voltage which exceeds the open circuit voltage of the divider 48, 50 by an amount equal to the turn-on emitter base voltage $V_{EB}$ of transistor 26. When this condition is reached, transistor 26 turns on and regeneratively turns on transistor 28. When this happens, the output voltage $V_{OUT}$ at terminal 24 is again clamped to the saturation voltage $V_{CE}$(SAT) of transistor 28 once the transistors 18 and 20 are turned off. The positive going step voltage produced at the base of transistor 28 when transistors 26 and 28 turn on is coupled through capacitor 13 to the base of transistor 18 and turns transistor 18 off, simultaneously with the turn-on of transistors 26 and 28. By regenerative action, transistor 20 is also turned off and the end of the monostable period is reached.

Hence, by regenerative action, the fall time of the output pulse is made extremely fast, being limited only by the saturation resistance of transistor 28 and the output load capacitance. Similarly, when the regenerative pair 10 is turned on, the output rise time is extremely fast and is limited only by the saturation resistance of transistor 18 and the output load capacitance.

Even at extremely low current levels with the high impedance levels of the micropower design of the above described monostable multivibrator circuit, both output pules rise and fall times are inherently fast due to the regenerative turn on and turn off action during both transitions of the output voltage. The trigger sensitivity may be made extremely high by designing voltage divider 42, 41 and divider 36, 38 to prebias the base of the input transistor 30 very close to its turn on threshold.

The duty cycle capability of the present multivibrator circuit is inherently high due to the rapid discharging of timing capacitor 46 by the emitter current of transistor 26 during the output pulse fall time. In specific designs of the above described monostable multivibrator circuit, it will be found that recovery time is determined by the time constant of resistor 54 and capacitor 56 rather than by the discharge time associated with the timing capacitor 46.

Another salient operating characteristic of the present monostable multivibrator circuit is its amenability to the simultaneous desensitization of the output pulse width (monostable period) to variations in ambient temperature and power supply voltage.

Figures 2A, 2B, 2C, 2D:
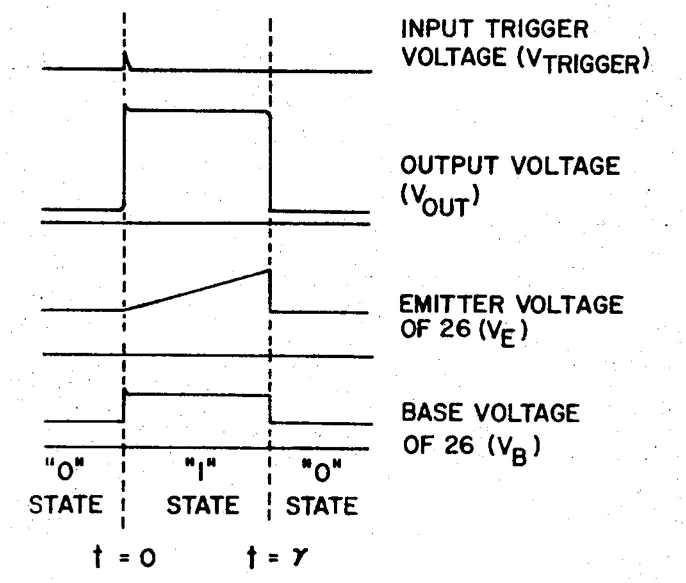
FIG. 2 illustrates the voltage waveforms at various points in the circuit of FIG. 1.

The various waveforms for the circuit in FIG. 1 are illustrated in FIG. 2 and include the input trigger pulse in FIG. 2A which produces a resultant output step voltage $V_{OUT}$ in FIG. 2B when the multivibrator switches to its quasistable one state. Once the voltage level of the output terminal $V_{ODT}$ reverse biases diode 22, the timing capacitor 46 begins to charge the emitter voltage of transistor 26 linearly toward supply voltage $V_{CC}$ as shown in FIG. 2C. When the emitter voltage of transistor 26 is sufficiently high to bias the latter into conduction, regenerative turn on action in the regenerative pair 12 and regenerative turn off action in the regenerative pair 10 begins. Such regenerative action produces a rapid fall time for the output pulse in FIG. 2B and a resultant voltage step at the base of transistor 26 as shown in FIG. 2D when the output voltage $V_{OUT}$ returns to its zero or standby state.

The following table of component values represent those values used in a circuit of the type described above which was actually built and successfully tested. However these values are not intended to limit the scope of this invention.

TABLE OF VALUES

| Resistor No.: | Component value, kilohms |
|---|---|
| 36 | 750 |
| 38 | 300 |
| 40 | 100 |
| 41 | 8.2 |
| 42 | 200 |
| 44 | 130 |
| 48 | 200 |
| 50 | 222 |
| 52 | 500 |
| 54 | 130 |

| Capacitor No.: | Picofarads |
|---|---|
| 13 | 22 |
| 34 | 30 |
| 46 | 550 |
| 56 | 33 |

$V_{CC}$—2.0 D.C. volts.

I claim:

1. A high performance complementary monostable multivibrator including, in combination:

a first regenerative transistor pair connected between a voltage supply terminal and a reference potential, a second regenerative transistor pair connected to said first regenerative transistor pair, the transistors in said first transistor pair being regeneratively turned on when said multivibator is switched from its standby state to its triggered state and said transistors in said second transistor pair being regeneratively turned on when said multivibrator returns to its standby state, input circuit means connected to said first and second transistor pairs and adapted to receive an input trigger pulse for coupling a turn on signal to said first regenerative transistor pair, timing circuit means coupled to said second regenerative transistor pair for applying thereto a timing signal for turning on the transistors in said second regenerative transistor pair a predetermined time after the transistors in said first regenerative transistor pair are turned on, to thereby return the multivibrator to its standby state, and a coupling capacitor connected between said first and second regenerative transistor pairs for coupling a turnoff signal to said second transistor pair when a trigger pulse is applied to said input circuit means.

2. The monostable multivibrator circuit as defined in claim 1 wherein said timing circuit means includes:

a first resistor connected between said voltage supply terminal and said second regenerative transistor pair, and a timing capacitor connected between said first resistor and a point of reference potential for charging to a voltage sufficient to turn on said second regenerative transistor pair and return the multivibrator to its standby state.

3. The monostable multivibrator as defined in claim 2 which further includes a diode connected between the two transistors in said second regenerative transistor pair and further connected to said timing circuit, said diode being reverse biased when said first regenerative transistor pair turns on and thereby disconnects said timing circuit from said first regenerative transistor pair.

4. A micropower complementary monostable multivibrator circuit including, in combination:

first and second complementary transistors connected in a first regenerative pair so that by a regenerative action, the first and second transistors tend to rapidly turn each other on upon receipt of a turn on signal, third and fourth complementary transistors connected in a second regenerative pair so that by regenerative action, the third and fourth transistors tend to rapidly turn each other on upon receipt of a timing signal, input circuit means connected to said first regenerative pair and providing a signal for turning on said first and second complementary transistors, means coupling a turn off signal from said input circuit means to said second regenerative pair upon receipt of a trigger pulse at said input circuit means, a common output terminal connected to said first and second regenerative transistor pairs and providing an output pulse when said multivibrator is triggered from its standby state to its triggered state, timing circuit means connected between a voltage supply terminal and said second regenerative transistor pair for charging to a predetermined voltage at a predetermined time after said multivibrator has been triggered from its standby state to its triggered state to thereby bias said third and fourth complementary transistors into conduction and return said monostable multivibrator to its standby state, said coupling means including a coupling capacitor connected between said first and second regenerative transistor pairs for coupling a turnoff pulse to said second regenerative pair upon receipt of a trigger pulse at said input circuit means, said timing circuit means further including second and third resistors connected between said voltage supply terminal and said reference potential, and a fourth resistor connected between the junction of said second and third resistors and said second regenerative transistor pair.

5. A micropower complementary monostable multivibrator circuit including, in combination:

first and second complementary transistors connected in a first regenerative pair so that by a regenerative action, the first and second transistors tend to rapidly turn each other on upon receipt of a turn on signal, third and fourth complementary transistors connected in a second regenerative pair so that by regenerative action, the third and fourth transistors tend to rapidly turn each other on upon receipt of a timing signal, input circuit means connected to said first regenerative pair and providing a signal for turning on said first and second complementary transistors, means coupling a turnoff signal from said input circuit means to said second regenerative pair upon receipt of a trigger pulse at said input circuit means, a common output terminal connected to said first and second regenerative transistor pairs and providing an output pulse when said multivibrator is triggered from its standby state to its triggered state, timing circuit means connected between a voltage supply terminal and said second regenerative transistor pair for charging to a predetermined voltage at a predetermined time after said multivibrator has been triggered from its standby state to its triggered state to thereby bias said third and fourth complementary transistors into conduction and return said monostable multivibrator to its standby state, said first and second transistors are connected with their base-collector paths in a regenerative loop between said voltage supply terminal and a point of reference potential, said third and fourth transistors are connected with their base-collector paths in a regenerative loop between said timing capacitor and said point of reference potential, a diode connected to said voltage output terminal and in the base-collector path of said third and fourth transistors, said diode being reverse biased when said first and second transistors are triggered into conduction to disconnect said timing circuit means from said output terminal, said timining circuit means charging to a predetermined voltage after said diode has become reverse biased to provide a turn on bias for said third and fourth transistors and return the monostable multivibrator to its standby conductive state.

6. The monostable multivibrator circuit as defined in claim 5 which further includes:

a coupling capacitor connected between said first and second regenerative transistor pairs for providing a turn off pulse to said second regenerative pair after a trigger pulse has been applied to said input circuit means; said coupling capacitor also providing a turn off pulse to said first transistor pair from said second transistor pair when said second transistor pair is turned on by a timing voltage on said timing capacitor, said multivibrator circuit further including a fifth resistor connected between said first transistor and said voltage supply terminal, a sixth resistor connected to said fifth resistor and in series therewith between said input circuit means and said voltage supply terminal; said fifth and sixth resistors constituting a first voltage divider for said first regenerative transistor pair;

said input circuit means including an input transistor capacitively coupled to an input terminal and having seventh and eighth resistors connected thereto in a second voltage divider configuration, said seventh and eighth resistors being adjustable to vary the turn on sensitivity of said input transistor, said coupling capacitor connected between said first voltage divider and said third transistor in said second regenerative transistor pair;

a ninth resistor connected between said first voltage divider and said second transistor in said first regenerative transistor pair for limiting the current in said second transistor when said first and second transistors are regeneratively turned on, and a tenth resistor connected in parallel with a capacitor between said second transistor and a point of reference potential, the time constant of said tenth resistor and said capacitor connected in parallel therewith determining the recovery time of said multivibrator, said capacitor connected in parallel with said tenth resistor also providing reinforcement of regenerative turn off action in said first regenerative transistor pair upon receipt of said turn off pulse from said second transistor pair when said second transistor pair is turned on by said timing voltage on said timing capacitor.

7. A multivibrator comprising:

a voltage supply line and a ground line, a first pair of complementary transistors, the base of each transistor of the pair being connected to the collector of the other of the pair, a second pair of complementary transistors, the base of each transistor of said second pair being connected to the collector of the other transistor of the second pair, means for connecting an emitter and a base of a first transistor of each of said pairs to one of said lines, means for connecting the emitter of the second ones of each of said transistors pairs to the other of said lines, one of said connection means including a timing circuit, and means for coupling a collector of one of said pair of transistors to a base of one of said other pair of transistors.

8. The invention of claim 7 and including means to apply a triggering pulse to one of said pair of transistors by way of said coupling means.

9. The invention of claim 8 in which said coupling means includes a capacitor and said means to supply a triggering pulse is connected to said coupling means between said capacitor and an element of a pair of transistors.

References Cited

UNITED STATES PATENTS

| | | | |
|---|---|---|---|
| 2,948,820 | 8/1960 | Bothwell | 307—273 |
| 3,268,738 | 8/1966 | Deavenport | 307—273 |

JOHN S. HEYMAN, Primary Examiner

R. C. WOODBRIDGE, Assistant Examiner

U.S. Cl. X.R.

307—288; 331—113